(12) United States Patent
Soares et al.

(10) Patent No.: US 10,354,975 B2
(45) Date of Patent: Jul. 16, 2019

(54) BARRIER LAYER FOR INTERCONNECTS IN 3D INTEGRATED DEVICE

(71) Applicant: Raytheon Company, Waltham, MA (US)

(72) Inventors: Edward R. Soares, Lompoc, CA (US); John J. Drab, Santa Barbara, CA (US)

(73) Assignee: Raytheon Company, Waltham, MA (US)

( * ) Notice: Subject to any disclaimer, the term of this patent is extended or adjusted under 35 U.S.C. 154(b) by 128 days.

(21) Appl. No.: 15/156,087

(22) Filed: May 16, 2016

(65) Prior Publication Data
US 2017/0330859 A1    Nov. 16, 2017

(51) Int. Cl.
*H01L 23/00* (2006.01)
*H01L 23/48* (2006.01)
(Continued)

(52) U.S. Cl.
CPC ...... *H01L 25/0657* (2013.01); *H01L 21/0273* (2013.01); *H01L 21/7685* (2013.01);
(Continued)

(58) Field of Classification Search
CPC ............ H01L 25/0657; H01L 27/0688; H01L 21/76885; H01L 23/585; H01L 21/7685;
(Continued)

(56) References Cited

U.S. PATENT DOCUMENTS 5,272,095 A    12/1993    Enquist et al.
5,318,916 A    6/1994    Enquist et al.
(Continued)

OTHER PUBLICATIONS

International Search Report and Written Opinion of the International Searching Authority for Corresponding International Application PCT/US2017/022284 dated Jun. 6, 2017.
(Continued)

*Primary Examiner* — Steven H Loke
*Assistant Examiner* — Juanita B Rhodes
(74) *Attorney, Agent, or Firm* — Renner Otto (57) ABSTRACT

An electronic device integration method and integrated electronic device. The integration method may include the steps of preparing a first electronic device by forming an electrically conductive trace overlying a substrate, forming a barrier layer overlying the electrically conductive trace, forming one or more electrically conductive interconnects on the barrier layer, and forming a bonding layer overlying the trace and/or at least partially surrounding the one or more interconnects. The barrier layer is configured to prevent formation of an intermetallic compound between the trace and interconnect structures, while still enabling electrical communication between the trace and interconnect. The integration method may further include the steps of direct bonding the first electronic device to a second electronic device, direct bonding a third electronic device to the second electronic device, and so on. A high-temperature treatment and functional testing of the vertically integrated electronic device may be conducted after each stack sequence.

15 Claims, 7 Drawing Sheets

(51) Int. Cl.
*H01L 23/58* (2006.01)
*H01L 25/00* (2006.01)
*H01L 27/06* (2006.01)
*H01L 21/027* (2006.01)
*H01L 21/768* (2006.01)
*H01L 21/822* (2006.01)
*H01L 25/065* (2006.01)
*H01L 23/66* (2006.01)
*H01L 21/66* (2006.01)

(52) U.S. Cl.
CPC .. *H01L 21/76871* (2013.01); *H01L 21/76883* (2013.01); *H01L 21/76885* (2013.01); *H01L 23/585* (2013.01); *H01L 23/66* (2013.01); *H01L 24/05* (2013.01); *H01L 24/80* (2013.01); *H01L 25/50* (2013.01); *H01L 27/0688* (2013.01); *H01L 21/8221* (2013.01); *H01L 22/14* (2013.01); *H01L 23/481* (2013.01); *H01L 24/03* (2013.01); *H01L 24/06* (2013.01); *H01L 24/08* (2013.01); *H01L 2223/6677* (2013.01); *H01L 2224/039* (2013.01); *H01L 2224/0345* (2013.01); *H01L 2224/0347* (2013.01); *H01L 2224/0348* (2013.01); *H01L 2224/0391* (2013.01); *H01L 2224/03416* (2013.01); *H01L 2224/03452* (2013.01); *H01L 2224/03462* (2013.01); *H01L 2224/03464* (2013.01); *H01L 2224/05082* (2013.01); *H01L 2224/05124* (2013.01); *H01L 2224/05166* (2013.01); *H01L 2224/05186* (2013.01); *H01L 2224/05647* (2013.01); *H01L 2224/05655* (2013.01); *H01L 2224/05686* (2013.01); *H01L 2224/0603* (2013.01); *H01L 2224/06051* (2013.01); *H01L 2224/06181* (2013.01); *H01L 2224/06505* (2013.01); *H01L 2224/08147* (2013.01); *H01L 2224/80001* (2013.01); *H01L 2224/80895* (2013.01); *H01L 2224/80896* (2013.01); *H01L 2224/80986* (2013.01); *H01L 2224/9202* (2013.01); *H01L 2225/06548* (2013.01); *H01L 2924/3651* (2013.01)

(58) Field of Classification Search
CPC ......... H01L 23/66; H01L 24/80; H01L 25/50; H01L 2224/05082; H01L 2224/0391; H01L 2224/039; H01L 2224/9202; H01L 2224/0345; H01L 2224/03416; H01L 21/8221; H01L 2224/08147; H01L 2224/80896; H01L 2224/06505; H01L 2224/06181; H01L 2223/6677; H01L 2224/05647; H01L 2224/03452; H01L 21/76871; H01L 24/05; H01L 2224/05166; H01L 2224/05124; H01L 2224/0347; H01L 2224/03464; H01L 2924/3651; H01L 24/08; H01L 24/06; H01L 2224/80001; H01L 2224/06051; H01L 2225/06548; H01L 2224/05686; H01L 2224/05655; H01L 2224/03462; H01L 22/14; H01L 2224/05186; H01L 2224/80986; H01L 24/03; H01L 2224/80895; H01L 2224/0603; H01L 21/0273; H01L 21/76883; H01L 2224/0349; H01L 23/481; H01L 2924/00014; H01L 2924/014; H01L 2924/05442; H01L 2924/04941; H01L 2924/04953; H01L 2924/01074; H01L 21/76898; H01L 2224/03
See application file for complete search history.

(56) References Cited

U.S. PATENT DOCUMENTS

| | | | |
|---|---|---|---|
| 6,242,794 B1 | 6/2001 | Enquist | |
| 6,368,930 B1 | 4/2002 | Enquist | |
| 6,500,694 B1 | 12/2002 | Enquist | |
| 6,563,133 B1 | 5/2003 | Tong | |
| 6,627,531 B2 | 9/2003 | Enquist | |
| 6,646,347 B2 | 11/2003 | Mercado et al. | |
| 6,740,909 B2 | 5/2004 | Enquist | |
| 6,756,281 B2 | 6/2004 | Enquist | |
| 6,822,326 B2 | 11/2004 | Enquist et al. | |
| 6,864,585 B2 | 3/2005 | Enquist | |
| 6,867,073 B1 | 3/2005 | Enquist | |
| 6,902,987 B1 | 6/2005 | Tong et al. | |
| 6,905,557 B2 | 6/2005 | Enquist | |
| 6,962,835 B2 | 11/2005 | Tong et al. | |
| 6,984,571 B1 | 1/2006 | Enquist | |
| 7,037,755 B2 | 5/2006 | Enquist | |
| 7,041,178 B2 | 5/2006 | Tong et al. | |
| 7,109,092 B2 | 9/2006 | Tong | |
| 7,126,212 B2 | 10/2006 | Enquist et al. | |
| 7,332,410 B2 | 2/2008 | Tong | |
| 7,335,572 B2 | 2/2008 | Tong et al. | |
| 7,335,996 B2 | 2/2008 | Tong | |
| 7,341,938 B2 | 3/2008 | Enquist | |
| 7,387,944 B2 | 6/2008 | Tong et al. | |
| 7,485,968 B2 | 2/2009 | Enquist et al. | |
| 2007/0037379 A1* | 2/2007 | Enquist ............ | H01L 21/76898 438/618 |
| 2007/0111386 A1 | 5/2007 | Kim et al. | |
| 2007/0187719 A1* | 8/2007 | Yuan ....................... | H01L 21/84 257/202 |
| 2013/0009321 A1* | 1/2013 | Kagawa ............ | H01L 21/76807 257/774 |
| 2013/0049787 A1* | 2/2013 | Yi ............................ | H01L 22/14 324/756.03 |
| 2013/0105663 A1 | 5/2013 | Endo et al. | |
| 2014/0117546 A1* | 5/2014 | Liu ......................... | H01L 24/80 257/751 |
| 2015/0033937 A1* | 2/2015 | Lashmore ........... | C01B 21/0641 89/36.02 |
| 2015/0108644 A1* | 4/2015 | Kuang .................... | H01L 24/06 257/751 |
| 2015/0108648 A1 | 4/2015 | Tsumura et al. | |
| 2015/0348943 A1* | 12/2015 | Chen ................. | H01L 21/76877 257/734 |
| 2016/0013160 A1* | 1/2016 | Chun ................... | H01L 23/3192 257/751 |

OTHER PUBLICATIONS

Drab, John, "Multilevel Wafer Stacking for 3D Circuit Integration," Raytheon Technology Today, pp. 30-31, Issue 1, 2015, USA.
Plossi, A; Krauter, G., "Wafer Direct Bonding: Tailoring Adhesion Between Brittle Materials." Materials Science and Engineering R25 (1999), pp. 1-88.

* cited by examiner

BARRIER LAYER FOR INTERCONNECTS IN 3D INTEGRATED DEVICE

FIELD OF INVENTION

The present invention relates generally to three-dimensionally integrated electronic devices, and more particularly to electronic devices, such as semiconductor devices, that are vertically bonded and electrically connected together to form three-dimensional electronic structures.

BACKGROUND

Electronic devices, such as semiconductor integrated circuits (ICs) or other semiconductor devices, are typically fabricated into and on a substrate, such as a silicon wafer, resulting in an IC area that must increase as the size and complexity of the IC increases. One trend in recent IC fabrication has been to increase the number and/or different types of ICs by vertically stacking and vertically interconnecting the ICs together. The vertically stacked ICs can be of different sizes, come from different size wafers, have different functions, be made of different materials, etc.

One method for realizing the approach of vertically stacking ICs is through a direct bond process in which vertical interconnect structures are bonded together between individually stacked ICs. This approach may be accomplished by using conventional wafer fabrication techniques, including wafer thinning, chemical-mechanical polishing, photolithography masking, via etching and deposition, and electrical interconnect and electrical trace deposition. The vertical electrical interconnection between stacked ICs can be formed as a result of the direct bond stacking, or as a result of a sequence of wafer fabrication techniques after direct bonded stacking.

A typical direct bond process provides an electronic device substrate, such as a semiconductor IC substrate, having a bonding layer and vertical interconnects extending through the bonding layer. The vertical interconnects are connected to electrical traces disposed on the substrate, which provide an electrical path to circuits or devices on the substrate. During the direct bond process, the bonding layer of one electronic device is contacted with the bonding layer of another electronic device, whereby a chemical bond may occur with or without temperature treatment. In addition, exposed portions of the vertical interconnects of the first electronic device are contacted with the vertical interconnects of the second electronic device to enable an electrical coupling between electronic devices in the vertically stacked electronic device assembly. Commonly, after the desired number of individual electronic devices have been vertically stacked, the stacked electronic device assembly undergoes a relatively high-temperature treatment to cause the vertical interconnects from each electronic device to be sufficiently diffusion bonded together.

SUMMARY OF INVENTION

While vertical interconnects between each electronic device are often made of the same material (e.g., nickel), such interconnects are often coupled to a metal trace made from a dissimilar metal (e.g., aluminum). This often causes the formation of an intermetallic compound when the interconnect and trace materials diffuse together, such as during a high-temperature treatment. The resulting intermetallic compound (e.g., nickel aluminide) may be a relatively brittle, low density compound compared to the interconnect or trace material, and the lower density of the intermetallic compound may cause volumetric expansion in the joint region between the interconnect and trace. Some prior thought has been that such intermetallic formation is advantageous because the volumetric expansion causes the interconnects of two adjacent electronic devices to be put in compression, which is believed to enable improved contact and diffusion between the interconnect structures of each device.

In contrast with this, an aspect of the present invention provides a barrier layer interposed between an electrical trace and an electrical interconnect for restricting interdiffusion between the interconnect and trace materials so as to prevent intermetallic compound formation during direct bond integration of a three-dimensional electronic device.

More particularly, it has been recognized as an aspect of the present invention that formation of intermetallic compounds having poor interdiffusion properties, such as nickel aluminide, impedes the ability to provide a reliably functional vertically integrated electronic device after conducting multiple high-temperature treatments during direct bond processing. This is because as the number of high-temperature treatments increases, the formation of the lower density intermetallic region also increases, and the expansion of the higher volumetric region at the joint caused by the growing intermetallic region may eventually cause separation or voids that interrupt the electrical path between trace and interconnect. Moreover, the formation of such an intermetallic compound is typically an uncontrolled process, which impairs the ability to predict the long-term functionality of the device.

It is commonly understood that the economic success of a direct bond approach to vertically stacked electronic device assemblies often depends on the yield and cost associated with the vertical stacking and interconnection process. Typically, to ensure that the stacked electronic device assembly is fully functional, testing is conducted after the desired number of stacked electronic devices have been permanently bonded via the final high-temperature treatment. However, such an approach can often lead to unnecessary process waste, as even one flawed electronic device out of many good electronic devices in the stacked assembly may cause the entire vertically integrated electronic device to be scrapped.

By providing the exemplary barrier layer and preventing the formation of the intermetallic compound between interconnect and trace, multiple high-temperature treatments may be achieved, for example after stacking each individual electronic device, thereby enabling the ability to functionally test and detect failures in the stacked electronic device assembly much earlier in the process compared to the conventional method. By detecting flaws earlier in the process, scrap may be reduced, and the yield and cost to vertically stack and interconnect such integrated electronic devices may be improved over the conventional method.

According to an aspect of the invention, a method of forming an electronic device, includes: (i) forming an electrically conductive trace on a substrate; (ii) forming a barrier layer on the electrically conductive trace; and (iii) forming one or more electrically conductive interconnects on the barrier layer.

The electrically conductive trace and the one or more electrically conductive interconnects may be made from different metals or metal alloys that are capable of forming an intermetallic compound having poor interdiffusion properties. The barrier layer may be configured to prevent formation of such an intermetallic compound, while still enabling electrical communication between the trace and interconnect structures.

According to another aspect of the invention, an integration method for an electronic device may include: (i) preparing a first electronic device having a first substrate, which may include: (a) forming a first electrically conductive trace overlying at least a portion of the first substrate, (b) forming a first barrier layer overlying at least a portion of the first electrically conductive trace, (c) forming one or more first electrically conductive interconnects in contact with the first barrier layer, and (d) forming a first bonding layer overlying at least a portion of the first electrically conductive trace and at least partially surrounding the one or more first interconnects. The integration method may further include: (ii) preparing a second electronic device having a second substrate, one or more second electrically conductive interconnects, and a second bonding layer; (iii) contacting the one or more first interconnects with the one or more second interconnects; and (iv) contacting the first bonding layer with the second bonding layer.

Embodiments of the invention may include one or more of the following additional features separately or in combination.

For example, the integration method may further include: (i) bonding the first bonding layer to the second bonding layer; and (ii) bonding via temperature treatment the one or more first interconnects to the one or more second interconnects, whereby diffusion occurs between the one or more first interconnects and the one or more second interconnects.

The integration method may further include: (i) forming a second electrically conductive trace on at least a portion of the second substrate; (ii) forming a second barrier layer on at least a portion of the second electrically conductive trace; (iii) forming the one or more second electrically conductive interconnects in contact with the second barrier layer; and (iv) forming the second bonding layer on at least a portion of the second trace and at least partially surrounding the one or more second interconnects.

The integration method may further include: (i) preparing an opposite side of the second electronic device, which may include: (a) forming a third electrically conductive trace overlying at least a portion of the second substrate opposite the second electrically conductive trace; (b) forming a third barrier layer overlying at least a portion of the third electrically conductive trace; (c) forming one or more third electrically conductive interconnects in contact with the third barrier layer; and (d) forming a third bonding layer overlying at least a portion of the third electrically conductive trace and at least partially surrounding the one or more third interconnects. The integration method may further include: (ii) preparing a third electronic device having a third substrate, one or more fourth electrically conductive interconnects, and a fourth bonding layer; (iii) bonding via direct contact the third bonding layer to the fourth bonding layer; and (iv) bonding via temperature treatment the one or more third interconnects to the one or more fourth interconnects, whereby diffusion occurs between the one or more third interconnects and the one or more fourth interconnects.

The bonding via temperature treatment of the one or more first interconnects to the one or more second interconnects may result in completion of a first integration stacking sequence. The bonding via temperature treatment of the one or more third interconnects to the one or more fourth interconnects may result in completion of a second stacking sequence. The integration method may further include repeating N stacking sequences to define a vertically integrated stacked electronic device assembly.

The vertically integrated stacked electronic device assembly may be tested after each bonding via temperature treatment.

The integration method may further include: (i) removing a portion of the first and second bonding layers to expose respective outwardly addressable faces of the one or more first interconnects and the one or more second interconnects; and (ii) contacting the faces of the one or more first interconnects with the respective faces of the one or more second interconnects.

The integration method may further include: (i) forming a first photoresist layer overlying at least a portion of the first barrier layer; and (ii) patterning the first photoresist layer to form one or more channels in the first photoresist layer. The one or more first interconnects may be formed in the one or more channels in the first photoresist layer.

The integration method may further include: after patterning the first photoresist layer, and after forming the one or more first interconnects, removing at least a portion of the first photoresist layer such that the one or more first interconnects remain.

The integration method may further include: forming a first seed layer overlying at least a portion of the first barrier layer, the first barrier layer being configured to accept formation of the first seed layer thereon. The first seed layer may be interposed between the first barrier layer and the one or more first interconnects. The first seed layer may be configured to accept formation of the one or more first interconnects such that at least those portions of the first seed layer in contact with the one or more first interconnects become an integral portion of the one or more first interconnects.

The integration method may further include: after forming the one or more first electrically conductive interconnects and before forming the first bonding layer, patterning the first electrically conductive trace. The patterning may remove at least a portion of the first electrically conductive trace and at least a portion of the first barrier layer.

The integration method may further include: forming a first adhesion layer overlying at least a portion of the first substrate. The first adhesion layer may be interposed between the first substrate and the first electrically conductive trace.

The integration method may further include: forming one or more electrically conductive vias through the second substrate to electrically connect the second electrically conductive trace with the third electrically conductive trace.

The first electrically conductive trace may be made with a first metallic material, and the one or more first electrically conductive interconnects may be made with a second metallic material that is different from the first metallic material.

The first barrier layer may be interposed between the first electrically conductive trace and the one or more first electrically conductive interconnects, the first barrier layer being configured to prevent interdiffusion of the one or more first interconnects with the first trace.

The first electrically conductive trace may be made from a transition metal or post-transition metal, such as aluminum or aluminum alloy.

The first electrically conductive interconnect may be made from a post-transition metal or transition metal, such as copper or copper alloy.

The first bonding layer may be made from a non-metallic oxide, such as silicon oxide.

The first electrically conductive trace may be formed by physical vapor deposition, chemical vapor deposition, vapor phase deposition, or sputtering.

The barrier layer may be formed by physical vapor deposition, chemical vapor deposition, vapor phase deposition, or sputtering.

The one or more first interconnects may be formed by physical vapor deposition, chemical vapor deposition, sputtering, or electroplating.

The first bonding layer may be formed by chemical vapor deposition, sputtering, spin-on glass process, or plasma enhanced CVD.

According to another aspect of the invention, an integrated 3D electronic device includes a first electronic device having: a first substrate; a first plurality of electrically conductive traces disposed on at least a portion of the first substrate; a first plurality of electrically conductive interconnects disposed in contact with the first plurality of electrically conductive traces; a first plurality of barrier layers interposed between the respective first plurality of electrically conductive traces and the first plurality of electrically conductive interconnects; and a first bonding layer at least partially overlying the first substrate and at least partially surrounding the first plurality of interconnects. The first plurality of barrier layers are configured to prevent interdiffusion between the respective first plurality of electrically conductive traces and the first plurality of electrically conductive interconnects.

Embodiments of the invention may include one or more of the following additional features separately or in combination.

For example, the integrated 3D electronic device may further include a second electronic device having: a second substrate; a second plurality of electrically conductive traces disposed on at least a portion of the second substrate; a second plurality of electrically conductive interconnects disposed in contact with the second plurality of electrically conductive traces; a second plurality of barrier layers interposed between the respective second plurality of electrically conductive traces and the second plurality of electrically conductive interconnects; and a second bonding layer at least partially overlying the second substrate. The second plurality of barrier layers are configured to prevent interdiffusion between the respective second plurality of electrically conductive traces and the second plurality of electrically conductive interconnects.

The first bonding layer may be bonded to the second bonding layer, and at least one of the first plurality of interconnects may be diffusion bonded to at least one of the second plurality of interconnects.

The first plurality of barrier layers may be configured to accept formation of respective first seed layers thereon. The first seed layers may be compatible with the first plurality of electrically conductive interconnects for promoting electrodeposition of the respective first plurality of electrically conductive interconnects, such that the first seed layers may thereby form respective integral portions of the first plurality of electrically conductive interconnects.

At least one of the first plurality of electrically conductive traces and the second plurality of electrically conductive traces may be made from aluminum or aluminum alloy.

At least one of the first plurality of electrically conductive interconnects and the second plurality of electrically conductive interconnects may be made from nickel or nickel alloy.

At least one of the first plurality of barrier layers and the second plurality of barrier layers may be made from titanium nitride, titanium tungsten, tantalum, and/or tantalum nitride.

At least one of the first bonding layer and the second bonding layer may be made from an oxide, such as a non-metal oxide, for example silicon oxide.

The following description and the annexed drawings set forth certain illustrative embodiments of the invention. These embodiments are indicative, however, of but a few of the various ways in which the principles of the invention may be employed. Other objects, advantages and novel features according to aspects of the invention will become apparent from the following detailed description when considered in conjunction with the drawings.

BRIEF DESCRIPTION OF THE DRAWINGS

The annexed drawings, which are not necessarily to scale, show various aspects of the invention.

DETAILED DESCRIPTION

An exemplary electronic device integration method and exemplary integrated electronic device are disclosed. The integration method may include the steps of preparing a first electronic device, such as a semiconductor IC, by forming an electrically conductive trace overlying a substrate, forming a barrier layer overlying the electrically conductive trace, forming one or more electrically conductive interconnects on the barrier layer, and forming a bonding layer overlying the trace and/or at least partially surrounding the one or more interconnects. The barrier layer is configured to prevent formation of an intermetallic compound between the trace and interconnect structures, while still enabling electrical communication between the trace and interconnect. The integration method may further include the steps of direct bonding the first electronic device to a second electronic device, direct bonding a third electronic device to the second electronic device, and so on. A high-temperature treatment and functional testing of the vertically integrated electronic device may be conducted after each stack sequence.

The principles of the present invention have particular application to electronic devices such as vertically integrated semiconductor integrated circuit (IC) devices, including application specific integrated circuits (ASICs), memory chips, monolithic microwave integrated circuits (MMICs), etc., and will be described below chiefly in this context. It is understood, however, that principles of this invention may be applicable to other electronic devices where it is desirable to provide a barrier layer interposed between an electrical trace and an electrical interconnect for electrically connecting and vertically integrating stacked layers of a direct bonded electronic device so as to prevent the detrimental effects of intermetallic compound formation between the electrical interconnects and electrical trace. Non-limiting examples of these other electronic devices include non-semiconductor devices, such as passive radio frequency (RF) circuits (for example, filters or antenna arrays), or other semiconductor devices, such as diodes, photocells, transistors, sensors, and the like. The exemplary method of forming the exemplary electronic device may also be applicable to vertically integrating both active and passive electronic devices.

Figure 1A:
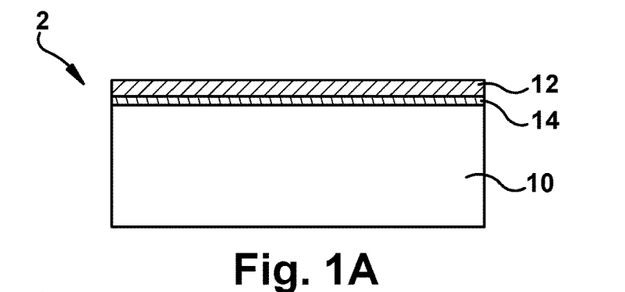
FIGS. 1A-1J are schematic cross-sectional views depicting exemplary process steps of forming an exemplary electronic device according to the invention.
Figure 1B:
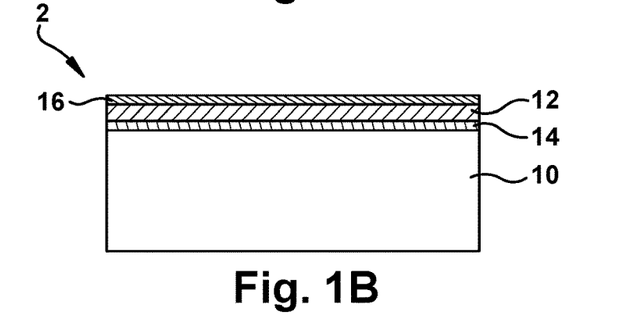
Figure 1C:
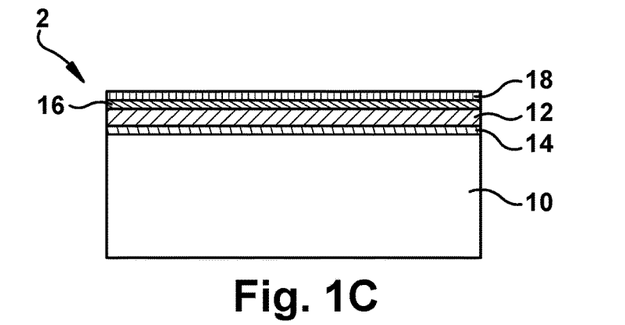
Figure 1D:
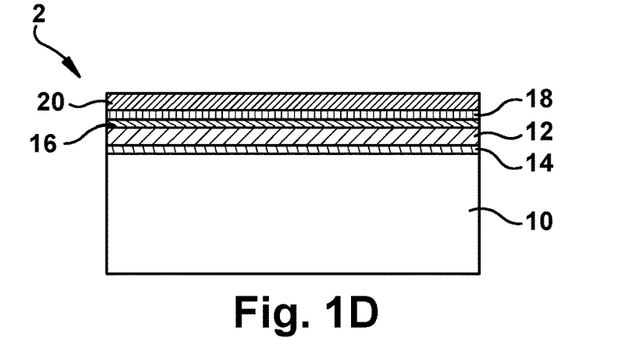
Figure 1E:
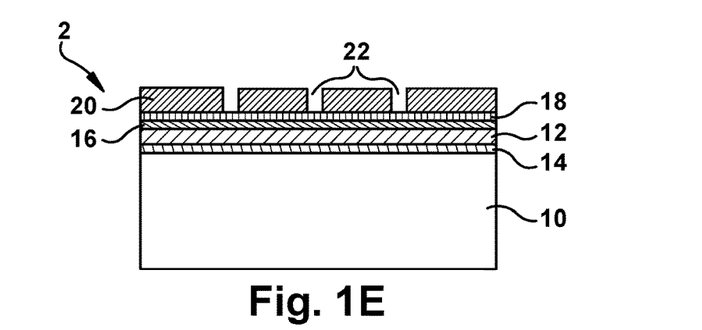
Figure 1F:
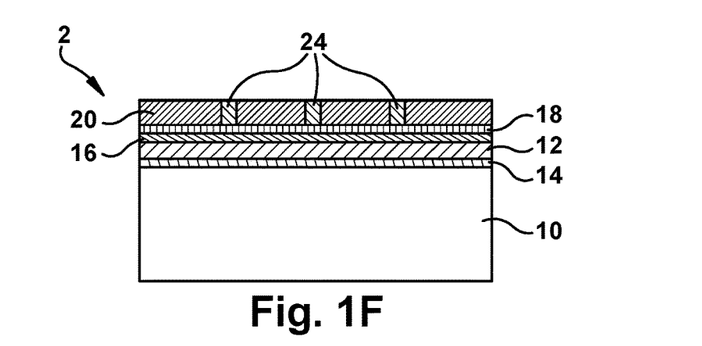
Figure 1G:
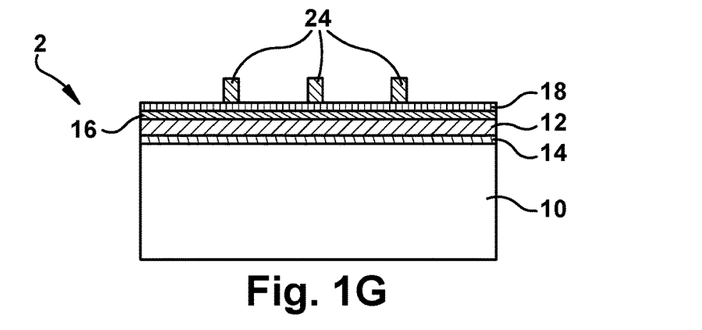
Figure 1H:
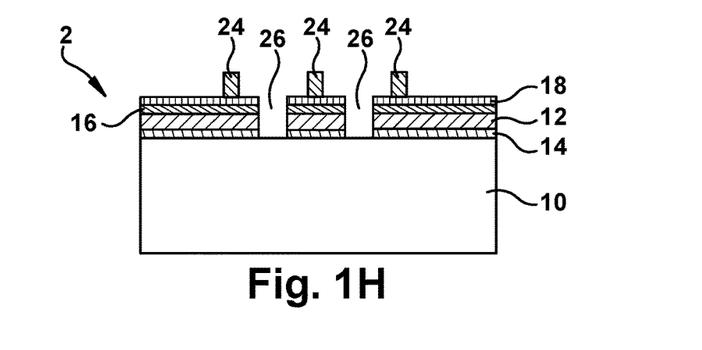
Figure 1I:
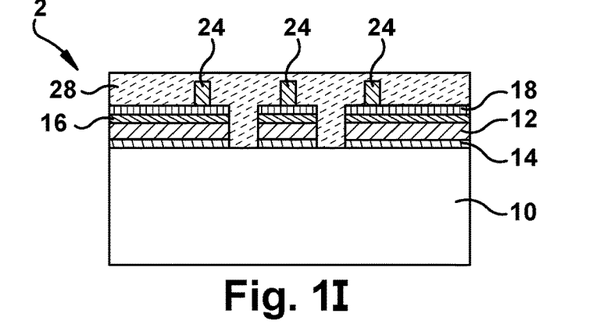
Figure 1J:
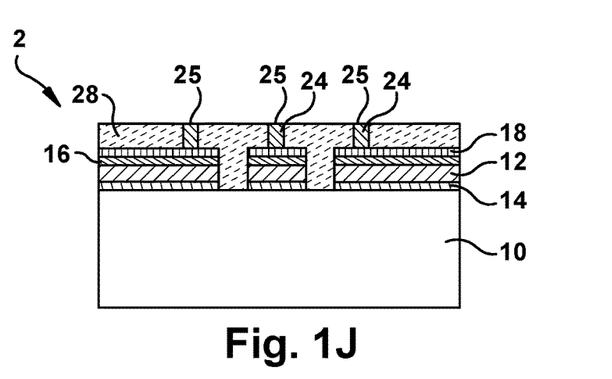

In the discussion above and to follow, the terms "upper", "lower", "top", "bottom," "left," "right," "horizontal," "vertical," etc. refer to an exemplary integrated electronic device as viewed in a horizontal position, as shown in FIG. 1J, for example. This is done realizing that these devices can be oriented in various other positions when manufactured, or when implemented in other electronic devices, or when packaged, etc.

Turning to FIGS. 1A-1J, an exemplary method of forming an exemplary electronic device is shown. In the illustrated embodiment, the electronic device is a semiconductor device 2. Referring initially to FIG. 1A, a substrate 10 is provided, and an electrically conductive trace 12 (also referred to as a trace 12) is formed overlying at least a portion of an upper planar surface of the substrate 10. Typically, the substrate 10 is made of silicon or III-V materials. The trace 12 is typically made of an electrically conductive metal or alloy, such as aluminum or aluminum alloys, copper or copper alloys, or gold. The trace 12, or trace layer, may be formed on the substrate 10 in a suitable manner well-known in the art, such as by a deposition process, which may include physical vapor deposition, chemical vapor deposition, plasma enhanced chemical vapor deposition, vapor phase deposition, electroplating, sputtering, or the like.

Optionally, an adhesion layer 14 may be formed along at least a portion of the upper planar surface of the substrate 10 prior to forming the trace 12, as shown in the illustrated embodiment of FIG. 1A. The adhesion layer 14 may be configured with a suitable thickness and may be made of a suitable material to enable improved adhesion of the trace 12 to the substrate 10. In addition, where the trace 12 is made of a conductive metal, such as aluminum, the adhesion layer 14 may be configured to prevent diffusion of the trace 12 into the underlying substrate 10, which may prevent inter-level or intra-level shorts through the substrate 10, or may prevent junction leakage. The adhesion layer 14 may be made of titanium, titanium nitride, tantalum nitride, titanium tungsten, or the like. The adhesion layer 14 may have a thickness of about 0.005 to 0.02 microns. As shown, the adhesion layer 14 may be deposited directly on the substrate 10 and may be in direct contact with the trace 12. In this manner, it is understood that the term "disposed on" or "on" (or "overlying") as used herein, refers to direct or indirect contact of one element with another element, whereas the term "directly on" refers to direct contact of one element with another element, but not indirect contact between elements.

Turning to FIG. 1B, a barrier layer 16 is formed along at least a portion of an upper planar surface of the trace 12 prior to depositing one or more electrically conductive interconnects 24 (also referred to as interconnects 24) (shown in FIG. 1F). As discussed in further detail below, the interconnects 24 are typically made from an electrically conductive metal that is dissimilar from the metal that forms the trace 12. For example, the interconnects 24 may be made from a transition metal, such as nickel, or a nickel alloy, or copper/ copper alloy, or the like. If the dissimilar interconnect and trace metals are in direct contact with each other and are allowed to interdiffuse, then an intermetallic compound may be formed at the interfacial joining region between the interconnect 24 and trace 12. The resulting intermetallic compound may be a relatively brittle and/or low density compound compared to the interconnect or trace material, and the lower density of the intermetallic compound may cause volumetric expansion in the joint region between the interconnect 24 and trace 12. For example, where the interconnect 24 is made of nickel (density of 8.9 g/cc), and the trace 12 is made of aluminum (density of 2.7 g/cc), the resulting intermetallic compound may be nickel aluminide having a density of about 7.1 g/cc. The nickel aluminide intermetallic may be composed of NiAl, $NiAl_3$, or $Ni_3Al$, and may exhibit poor interdiffusion properties resulting in the brittle and/or low density intermetallic compound. As discussed above, the formation of such low density intermetallic compounds may enhance expansion of the higher volumetric intermetallic region at the joint, which may eventually cause separation or voids that interrupt the electrical path between the trace 12 and interconnect 24. Furthermore, such brittle and/or low density intermetallic compounds are typically formed in an uncontrolled process, which impairs the ability to predict the long-term reliability of the device.

As shown, the exemplary barrier layer 16 is interposed between the trace 12 and interconnect 24, and is also configured to restrict interdiffusion between the trace and interconnect materials so as to prevent intermetallic compound formation therebetween. In addition, the barrier layer 16 is configured to have sufficient electrical conductivity (for example, greater than about $10 \times 10^6$ Siemens per meter) so as to promote electrical communication between the trace 12 and interconnect 24. The barrier layer 16 may be made from titanium, tantalum, tungsten, vanadium, or other refractory metal compounds. Preferably, the barrier layer 16 is made from titanium nitride (e.g., TiN), titanium tungsten (e.g., TiW), or tantalum nitride (e.g., TaN) compounds. The barrier layer 16 is preferably thick enough to prevent intermetallic formation, but is also preferably thin enough to prevent interruption of the electrical signal between trace 12 and interconnect 24. In this regard, the barrier layer 16 may have a maximum thickness that is less than the thickness of the trace 12 and/or less than the thickness of the interconnect 24. For example, the barrier layer 16 may have a thickness of about 0.005 to 0.05 microns. The barrier layer 16 may be formed on the trace 12 in a suitable manner well-known in the art, such as by a deposition process, including physical vapor deposition, chemical vapor deposition, plasma enhanced chemical vapor deposition, vapor phase deposition, electroplating, sputtering, or the like. Although the barrier layer 16 is shown as covering the entire layer of the trace 12, it is understood that the barrier layer 16 may be selectively applied to regions of the trace 12 that are intended to be in contact with the one or more interconnects 24.

As shown in FIG. 1C, a seed layer 18 may optionally be formed along at least a portion of an upper planar surface of the barrier layer 16 prior to depositing the one or more interconnects 24 (shown in FIG. 1F). The seed layer 18 is made from a material that is compatible with the interconnects 24, and the seed layer 18 is used in a subsequent step to enable deposition of the interconnects 24 on the barrier layer 16, as discussed below. Preferably, the seed layer 18 is made from the same material as the interconnects 24 (e.g., nickel) such that the seed layer 18 may be considered a continuous and integral part of the vertical interconnect structure. The seed layer 18 may have a thickness of about 0.005 to 0.05 microns, and may be formed on the barrier layer 16 in a suitable manner well-known in the art, such as by deposition, including those deposition processes described above. Where the seed layer 18 is utilized, the barrier layer 16 may be configured to accept formation of the seed layer 18 thereon. For example, the barrier layer 16 may have a suitable thickness, a suitable surface preparation, a suitable composition, and/or an optimal crystallographic orientation for accepting formation of the seed layer 18 thereon. In this manner, the barrier layer 16 should also have suitable properties to act as an adhesion layer for forming and adhering the seed layer 18 or any other desired layers thereon.

Referring to FIG. 1D, a photoresist layer 20 is deposited along at least a portion of the upper planar surface of the barrier layer 16, or optionally deposited along at least a portion of an upper planar surface of the seed layer 18 (as shown). The photoresist layer 20 may be deposited according to conventional methods well known in the art, for example by spin coating, to produce a relatively uniform layer that is about 0.5 to 2.5 micrometers thick.

Referring to FIG. 1E, one or more channels 22, or via holes, are formed in the photoresist layer 20 using conventional photolithographic patterning and/or etching techniques. For example, a photomask having the desired pattern for forming the channels 22 may be placed over the photoresist layer 20, and UV light may be directed through the mask holes to expose those portions of the photoresist layer 20 corresponding to the channels 22. Thereafter, the photoresist layer 20 may be developed in a conventional manner to remove those portions of the photoresist layer 20 exposed to the UV light, whereby the channels 22 may be formed. The channels 22 may be distributed uniformly or may be scattered in a predetermined pattern over the two-dimensional plane defined by the substrate 10. As shown in the illustrated embodiment, the channels 22 extend through the entire photoresist layer 20 to expose upper surface portions of the underlying seed layer 18.

Referring to FIG. 1F, the electrically conductive interconnects 24 are then formed in the channels 22. The interconnects 24 may be formed by an electroless plating process (e.g., electroless nickel plating) to fill the channels 22. In this manner, the metal for the interconnects 24 (e.g., nickel) is deposited via electroplating on the exposed portions of the seed layer 18 made of the same or compatible material (e.g., nickel), whereby the seed layer 18 becomes an integral part of the vertical interconnect structure. In this manner, it is understood that the term "electrically conductive interconnect," or "interconnect," or "interconnect structure" as used herein includes the interconnect 24 and at least that portion of the integral seed layer 18 underlying the interconnect 24. As discussed above, the interconnects 24 (e.g., nickel) are typically made of a dissimilar material from the underlying trace 12 material (e.g., aluminum), and therefore the interconnect structures (interconnects 24 and seed layer 18) are disposed on the barrier layer 16 to prevent interdiffusion and formation of a lower density intermetallic compound (e.g., nickel aluminide) between the interconnects and trace.

Referring to FIG. 1G, at least a portion of the photoresist layer 20 is then removed and the one or more interconnects 24 remain as free-standing structures extending away from the upper surface of the substrate 10 or, more specifically, from the seed layer 18. Following stripping of the photoresist layer 20, the electrically conductive trace 12 may be patterned (as shown in FIG. 1H) using standard photolithographic and etching techniques. For example, the trace 12 may be patterned into discrete segments by forming one or more channels 26 that extend through the various layers, including the seed layer 18, the barrier layer 16, the trace layer 12, and the adhesion layer 14. The trace layer 12 may be segmented in such a way so as to provide discrete electrical paths that contact and electrically interconnect devices or circuit structures (not shown) formed on or in the substrate 10. The substrate 10 may also contain an integrated circuit to which the trace or traces 12 are connected. Optionally, the channels 26 may extend through the substrate 10 to segment the substrate 10 into one or more dies, which may thereafter be direct bonded to other semiconductor devices, as discussed below.

As shown in FIG. 1I, a bonding layer 28 is deposited along at least a portion of the upper surface of the exemplary device to cover the trace 12 and at least partially surround the one or more interconnects 24. The bonding layer 28 may be a conformal dielectric film, and preferably has a low dielectric constant, for example in the range of 1-3. The bonding layer 28 is preferably at least as thick as the interconnects 24, but as thin as possible to optimize performance. The bonding layer 28 may be a non-metallic material made from an oxide, such as a silicon oxide, for example silicon dioxide. The bonding layer 28 may be formed by a deposition process, including physical vapor deposition, chemical vapor deposition, plasma enhanced chemical vapor deposition, sputtering, or a spin-on glass process.

Turning to FIG. 1J, a polishing process, such as chemomechanical polishing (CMP), may be used to planarize at least a portion of the upper surface of the bonding layer 28. In addition, the polishing process may expose outwardly addressable faces 25 of one or more of the interconnects 24. As shown in the illustrated embodiment, the bonding layer 28 and interconnects 24 have been polished to have respective upper surfaces that are coplanar with each other. The height of the interconnects 24 relative to the upper surface of the substrate 10 may also be controlled with the polishing process. The CMP process typically has a number of process variables including but not limited to the type of polishing slurry, rate of slurry addition, polishing pad, polishing pad oration rate, and polishing pressure. The specific type of metal for the interconnect 24 and/or type of non-metal for the bonding layer 28 may further affect the CMP process. These variables may be optimized to control the height of interconnects 24 and bonding layer 28 relative to the upper surface of the substrate 10, and may also be optimized to provide optimal surface roughness for the upper surface of the bonding layer 28 and/or the addressable faces 25 of the interconnects 24.

In an exemplary alternate process, the bonding layer 28 may be formed prior to forming the interconnects 24, such that channels (e.g., 22) may be formed in the bonding layer 28 and the interconnects 24 may be formed in the channels of the bonding layer 28. In this manner, the foregoing steps of providing the substrate 10, optionally forming the adhesion layer 14 overlying at least a portion of the substrate 10, forming the electrically conductive trace 12 overlying at least a portion of the adhesion layer 14, and optionally forming the seed layer 18 overlying at least a portion of the trace 12, may all be accomplished in substantially the same way as shown and described with respect to FIGS. 1A-1C. In the alternate process, the next step may be patterning the electrically conductive trace 12 using standard photolithographic and etching techniques, similarly to that which is shown and described with respect to FIG. 1H. At this point in the alternate process, the interconnects 24 have not been formed. Following patterning of the trace layer 12, the bonding layer 28 is formed along at least a portion of the upper surface of the exemplary device to cover the patterned trace 12, similarly to that which is shown and described with respect to FIG. 1I. Following the formation of the bonding layer 28, channels or via holes (similar to channels 22) may be formed in the bonding layer using standard photolithographic and/or etching techniques (e.g., with the formation of a photoresist layer and selective etching of the channels). The channels in the bonding layer 28 may extend through the bonding layer 28 to expose the seed layer 18. Next, the electrically conductive interconnects 24 may be formed in the channels of the bonding layer 28, which may be accomplished in substantially the same way as that which is shown and described with respect to FIG. 1F. After the interconnect structures 24 have been deposited, at least a portion of the upper planar surface of the device may be prepared, such as by removing any residual photoresist and polishing the bonding layer 28, similarly to that which is described above to result in a device substantially as shown in FIG. 1J. Such an exemplary alternate process may be particularly advantageous where the material forming the electrically conductive interconnect is more compatible for deposition in a bonding layer (e.g., an oxide layer, such as silicon oxide), as opposed to being deposited in a photoresist layer. For example, nickel-based materials may be suitable for deposition in a photoresist layer, as discussed above, whereas copper-based materials may be more suitable for deposition in an oxide layer according to the exemplary alternate process discussed above.

After the upper surfaces of the bonding layer 28 and/or the interconnects 24 have been prepared (as shown in FIG. 1J, for example), the exemplary electronic device (e.g., semiconductor device 2) is ready to be vertically stacked and direct bonded with another electronic device. The other electronic device may be substantially the same as the exemplary semiconductor device 2, or the other electronic device may be different. For example, the other electronic device may be another semiconductor device of a different size, have a different function, or be made of different materials, all of which may be selected depending on the design considerations as understood by those having skill in the art. It is further understood that the exemplary electronic device (e.g., semiconductor device 2) may be vertically stacked and direct bonded with a non-semiconductor device, or with other active or passive electronic devices.

Figure 2A:
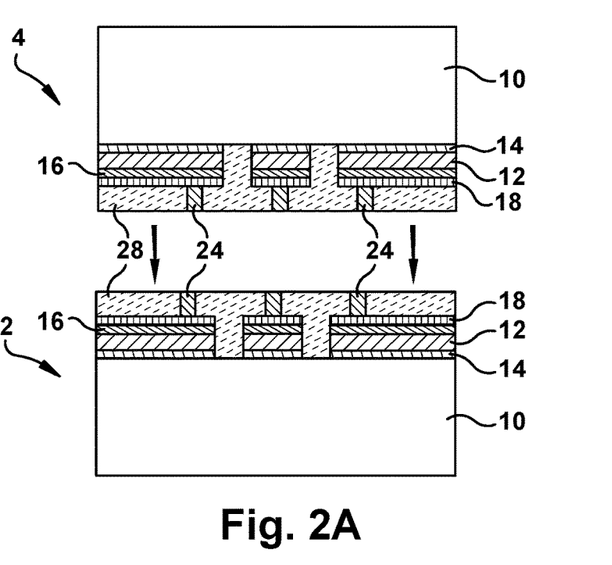
FIGS. 2A-2B are schematic cross-sectional views depicting exemplary process steps of stacking the electronic device of FIG. 1J with another exemplary electronic device.

Turning to FIG. 2A, an exemplary second semiconductor device 4 is shown as being ready for contacting and direct bonding with the exemplary first semiconductor device 2. In the illustrated embodiment, the second semiconductor device 4 is substantially the same as the above-referenced semiconductor device 2, and consequently the same reference numerals are used to denote the same or similar structures. In addition, the foregoing description of the exemplary semiconductor device 2, including the exemplary fabrication method thereof, is equally applicable to the second semiconductor device 4.

Figure 2B:
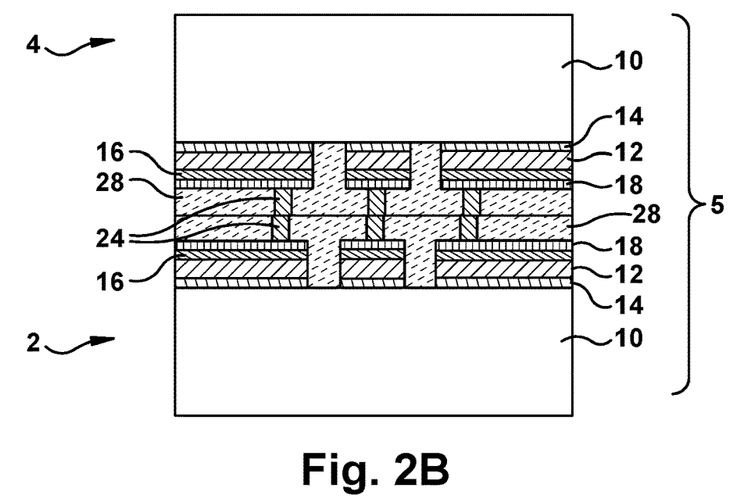

Referring to FIG. 2B, during the initial contacting of the two semiconductor devices 2, 4 at room temperature, the respective interconnects 24 are aligned, and at least a portion of each of the opposing surfaces of the devices 2, 4 may conform to each other by elastic deformation. Thereafter, direct bonding may occur between the opposing contact surfaces of each device 2, 4. In this manner, at least a portion of each of the opposing bonding layers 28 may bond together, and one or more of the opposing interconnects 24 may be contacted or bond together to form an electrical interconnection between the adjoining semiconductor devices 2, 4, which thereby forms a vertically integrated stacked semiconductor assembly 5.

More specifically, as the opposing bonding layers 28 contact at room temperature, the contacting non-metal (e.g., silicon oxide) regions began to form a bond at the contact point or points. The attractive bonding force between the semiconductor devices 2, 4 increases as the contact chemical bonding area increases. The chemical bond that develops between the opposing surfaces of each bonding layer 28 may be a covalent bond that reacts across surface elements to form a high bond strength that approaches, for instance, the fracture strength of the semiconductor device materials. The formation of the chemical bond between bonding layers 28 may be accelerated by a temperature treatment, for example, a low-temperature treatment of between about 150° C. to about 300° C.

A high-temperature treatment, for example greater than 300° C., such as about 350° C. or 400° C., may be performed during the direct bond process, for instance after the low-temperature chemical bonding of the non-metal oxide layer. This high-temperature treatment may promote interdiffusion between interconnects 24, which may result in grain growth between interconnects and also result in a preferable low-resistance electrical connection. Furthermore, due to the malleability and ductility of the metal interconnects 24, the pressure generated by the device-to-device bonding during the high-temperature treatment may result in a compression force that further brings the metal interconnects 24 into intimate contact at their respective faces 25. In this manner, a strong metallic bond may be formed between the intimately contacted interconnects 24 due to interdiffusion or self-diffusion of metal atoms at the mating interface between the opposing interconnects 24. This diffusion process is thermodynamically driven and is increased at higher temperatures. The temperature increase of the high-temperature treatment may thus enhance the metal bonding, metal contact, metal interconnect or conduction between interconnect structures 24. In this regard, the high-temperature treatment may characterize completion of the integration stacking sequence of the first two semiconductor devices 2, 4 to form the vertically integrated stacked semiconductor assembly 5. It is understood that the high-temperature treatment may be carried out with a variety of heating methods, including but not limited to thermal, infrared, and inductive. Examples of thermal heating include oven, belt furnace, and hot plate. An example of infrared heating is rapid thermal annealing.

Internal compression between opposing interconnects 24 may be generated as a result of the high-temperature treatment due to thermal expansion of the interconnect structures 24. For example, metals with high values of coefficient of thermal expansion (CTE), for example, copper, nickel, and gold, may result in more expansion at a given temperature. Furthermore, metals with a higher shear modulus, for example tungsten and nickel, will generate more stress for a given expansion. Metals with a high product of CTE and shear modulus, for example copper, tungsten, and nickel, will thus be the most effective at generating an increase in internal pressure with increased temperature. Furthermore, metals with a low yield stress, for example copper, nickel, and gold, preferably at very high purity, for example over 99.9%, are more readily deformed at lower stress and can thus result in improved metal bonding, metal contact, metal interconnect, and conductance between contact structures at lower stress. Interconnect structures 24 composed of metals with a high product of CTE and shear modulus, or high product of CTE and shear modulus normalized by yield stress, for example nickel, may thus be preferred to provide interconnect structures 24 that exhibit improved metal bonding, metal contact, metal interconnect, and conductance between interconnect structures as a result of internal compression generation with the high-temperature treatment.

Figure 3:
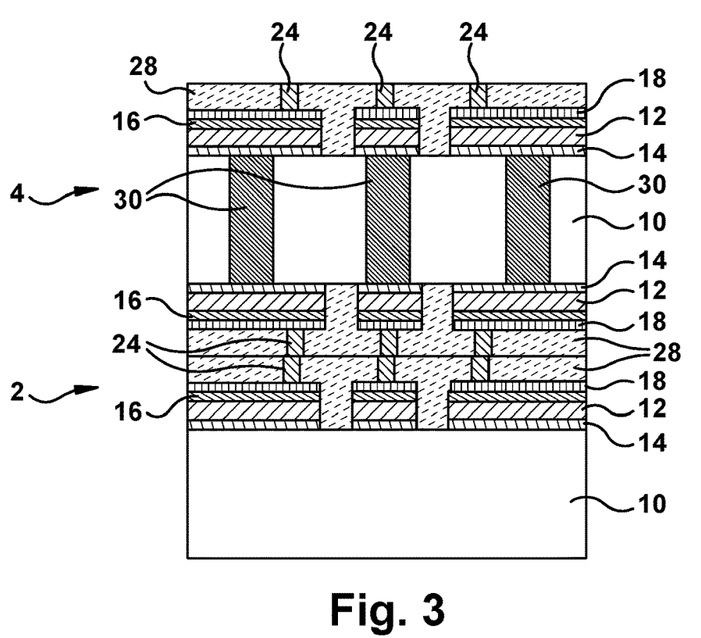
FIG. 3 is a schematic cross-section of the stacked electronic device assembly of FIG. 2B including vias and additional layers prepared for an additional stacking sequence.

Turning to FIG. 3, the exemplary process may repeat again on an opposite side of the semiconductor device 4 (upper side, as shown) by forming an electrically conductive trace 12 on the top side of the substrate 10, by forming a barrier layer 16 on the trace 12, and by forming one or more electrically conductive interconnects 24 on the barrier layer 16, which may all be formed in the same manner as described above. In addition, an adhesion layer 14 and a seed layer 18 may also be optionally formed on the opposite side of the second semiconductor device 4 in the manner described above.

As shown in the illustrated embodiment, the second semiconductor device 4 may undergo further preparation at some point during the exemplary process to form one or more electrically conductive vias 30 that extend through the substrate 10. The electrically conductive vias 30 may be configured to electrically connect interconnects 24 and/or traces 12 on opposite sides of the substrate 10, or may connect traces, circuits, devices or other features disposed in the substrate (not shown). The vias 30 may be formed in the substrate according to known methods, for example by photolithography and/or etching, to form via holes which are subsequently filled with a conductive metal, such as copper, for example by electroplating or other deposition process. In exemplary embodiments, the vias 30 may be formed after completion of the integration stacking sequence of the first two semiconductor devices 2, 4 to form the vertically integrated stacked semiconductor assembly 5.

Figure 4:
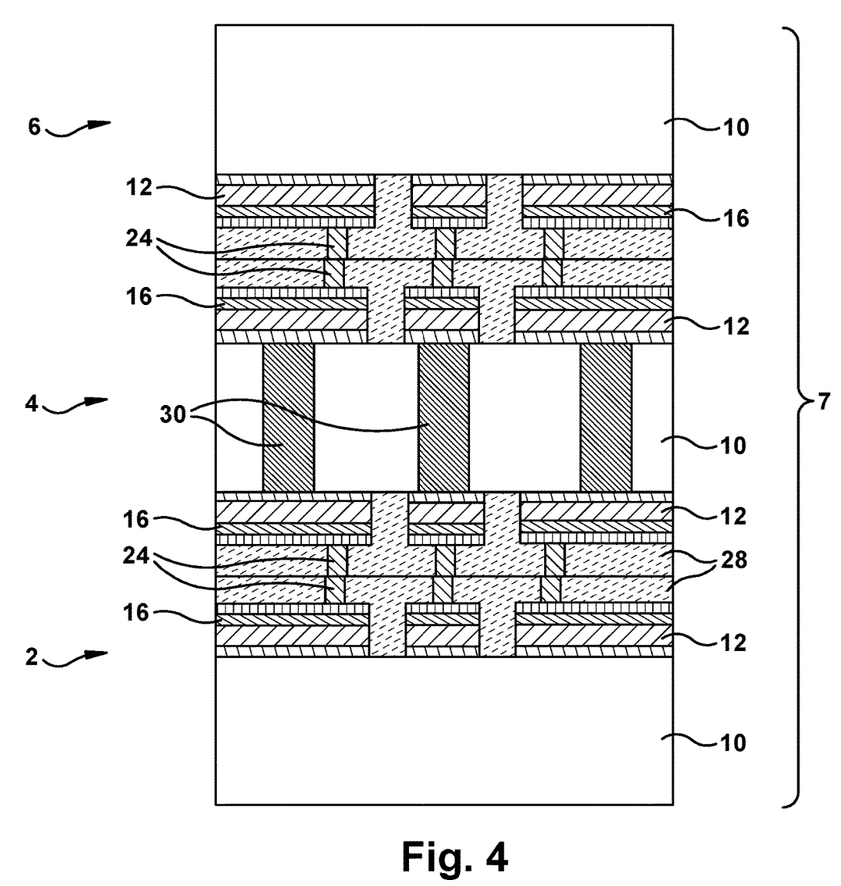
FIG. 4 is a schematic cross-section of an exemplary vertically integrated electronic device including the stacked electronic device assembly of FIG. 3 stacked with another exemplary electronic device.

Turning to FIG. 4, a third exemplary semiconductor device 6 is shown contacting and direct bonding with the top of the exemplary second semiconductor device 4. In the illustrated embodiment, the third semiconductor device 6 is substantially the same as the above-referenced first and second semiconductor devices 2 and 4, and consequently the same reference numerals are used to denote the same or similar structures. In addition, the foregoing description of the exemplary semiconductor devices 2 and 4, including the exemplary fabrication method thereof, is equally applicable to the third semiconductor device 6. Likewise, during the initial contacting of the second and third semiconductor devices 4, 6 at room temperature, the respective opposing interconnects 24 are aligned, and the opposing surfaces of the devices 4, 6 may thereafter direct bond and electrically interconnect to form a vertically integrated three-stack semiconductor assembly 7.

Advantageously, another high-temperature treatment (e.g., 350° C. for 2 hours, as described above) may be conducted after the stacking sequence of the third semiconductor device 6 to the second semiconductor device 4, which may characterize completion of the vertically integrated three-stack semiconductor assembly 7. Furthermore, it is understood that any number of stacking sequences may be conducted in accordance with the exemplary process described above, and after each stacking sequence a high-temperature treatment may be conducted to enhance the metal bonding, metal contact, metal interconnect or conduction between interconnect structures 24.

The barrier layers 16 interposed between the interconnects 24 and traces 12 in each stacked layer promotes the ability to conduct multiple high-temperature treatments of the stacked semiconductor assembly without the detrimental effects associated with intermetallic growth between the interconnects 24 and traces 12. Specifically, as discussed above, the exemplary barrier layers 16 are configured to restrict interdiffusion between the interconnect and trace materials so as to prevent intermetallic compound formation during direct bond integration, and more specifically during the high-temperature treatment, of the integrated three-dimensional semiconductor device. Such functionality of the exemplary barrier layers 16 thus prevents increased formation of the intermetallic regions as the number of subsequent high-temperature treatments also increases. In contrast, if the barrier layer 16 were not provided between the interconnect 24 and trace 12, such as with the conventional approach, the increased intermetallic formation after each subsequent high-temperature treatment could lead to increased volumetric expansion at the joint region between interconnect 24 and trace 12. This increasing formation of the intermetallic region could eventually lead to the creation of voids or separations that could interrupt or terminate the electrical connection between the trace 12 and interconnect 24, and therefore result in failure of the integrated semiconductor device.

The ability to fully functionally test the vertically integrated stacked semiconductor device 7 is typically provided after the high-temperature treatment in which the metal interconnects 24 are diffusion bonded together, preferably resulting in a low-resistance electrical connection between the stacked layers. Thus, by providing the exemplary barrier layer 16 and enabling multiple high-temperature treatments, for example after each stacking sequence, the ability to functionally test and detect failures in the stacked semiconductor assembly may be achieved much earlier in the process compared to the conventional method. By detecting flaws earlier in the process, scrap may be reduced, and the yield and cost to vertically stack and interconnect such integrated semiconductor devices may be improved over the conventional method.

Figure 5:
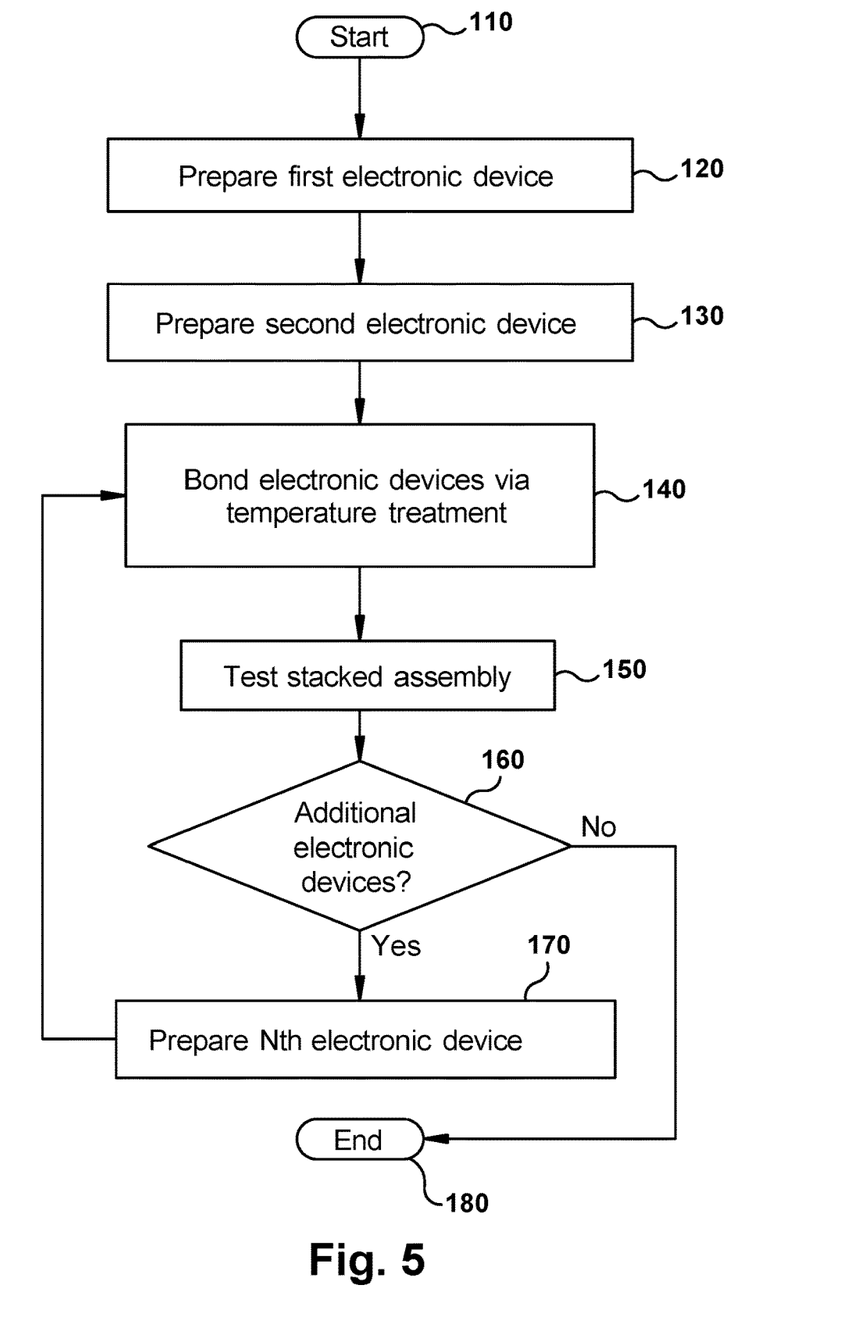
FIG. 5 is a flow diagram of an exemplary process for preparing, stacking, and testing an exemplary integrated electronic device.

FIG. 5 shows a flow chart for an exemplary method of integrating a three-dimensional (3D), i.e., stacked, electronic device, such as a 3D semiconductor device. The process starts at step 110. At step 120, the first electronic device is prepared, which generally corresponds with FIGS. 1A-1J described above. At step 130, the second electronic device is prepared, which may also generally correspond with the same process steps shown in FIGS. 1A-1J. At step 140, the electronic devices are direct bonded together, preferably with the high-temperature treatment, which generally corresponds with FIGS. 2A-2B described above. At step 150, the vertically electrically integrated stacked electronic device assembly is tested, which may be accomplished after each high-temperature treatment, as discussed above. At step 160, a decision is made whether additional electronic devices are to be prepared. If yes, then an additional Nth electronic device (e.g. third semiconductor device 6) is prepared at step 170, and the opposite side of the previously prepared electronic device (e.g., second semiconductor device 4) is also prepared, as shown and described with respect to FIGS. 3 and 4. If additional electronic devices are not required, then the process may end at step 180.

Figure 6:
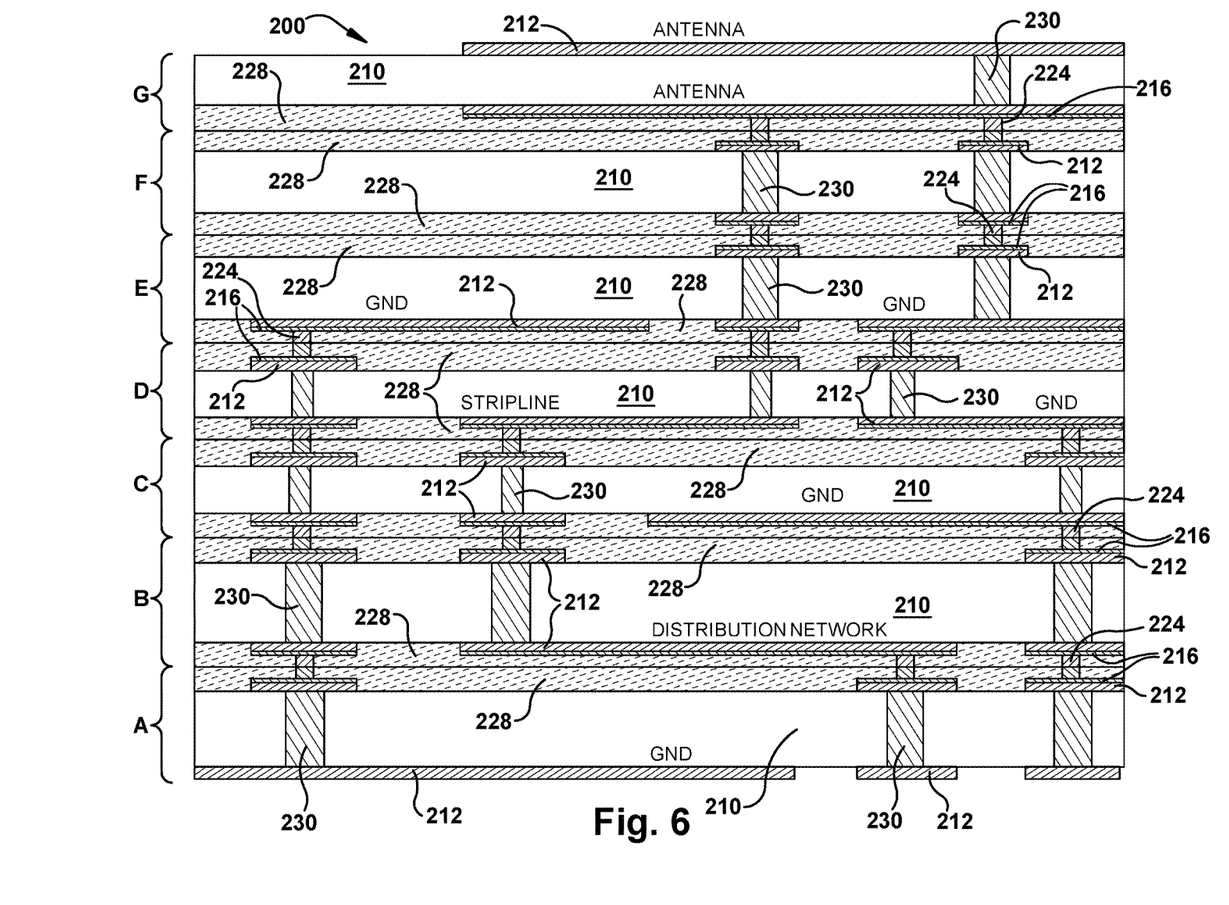
FIG. 6 is a schematic cross-section of an exemplary vertically integrated 3D electronic device.

FIG. 6 is a schematic cross-sectional view of another exemplary integrated electronic device 200. The electronic device 200 may be fabricated according to the foregoing exemplary method(s) for fabricating the above-referenced integrated semiconductor device 7, and consequently the same reference numerals but indexed by 200 are used to denote structures corresponding to similar structures in the integrated semiconductor devices, except as noted below. In addition, the foregoing description of the integrated semiconductor device 7 is equally applicable to the integrated semiconductor device 200.

As shown in the illustrated embodiment, the integrated electronic device 200 includes seven stacked layers of individual electronic devices A-G, which may include semiconductor devices, non-semiconductor devices, active electronic devices, and/or passive electronic devices, etc. Each layer A-G may include a substrate 210, an electrically conductive trace 212 disposed along at least a portion of the substrate 210, an electrically conductive interconnect 224 disposed along at least a portion of the trace 212, and a barrier layer 216 interposed between the interconnect 224 and trace 212. As shown, each layer A-G may include a plurality of traces 212, a plurality of interconnects 224, and a plurality of barrier layers 216 interposed between the respective pluralities of interconnects 224 and traces 212. In addition, each layer A-G may include electrically conductive vias 230 that electrically connect traces 212 on opposite sides of each substrate 210. As discussed above, each electronic device A-G may be direct bonded together by contacting opposing non-metal (e.g., silicon dioxide) bonding layers 228 and may be electrically interconnected by contacting and bonding opposing metal (e.g., nickel) interconnects 224.

As shown, the respective electronic devices A-G may have different configurations and may achieve different functions. For example, in the illustrated embodiment, the first electronic device layer A represents a ground layer. The second electronic device layer B represents a distribution network layer. The third electronic device layer C represents another ground layer. The fourth electronic device layer D represents a stripline transmission line layer and a ground layer. The fifth electronic device layer E represents two grounds. The sixth electronic device layer F represents an interconnection layer. The seventh electronic device layer G represents an antenna layer.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. An integration method for an electronic device comprising:
   preparing a first electronic device having a first substrate, including the following sequential steps:
   (i) forming a first electrically conductive trace overlying at least a portion of the first substrate,
   (ii) forming a first barrier layer overlying at least a portion of the first electrically conductive trace,
   (iii) forming one or more first electrically conductive interconnects in contact with the first barrier layer,
   (iv) patterning the first electrically conductive trace, wherein the patterning removes at least a portion of the first electrically conductive trace and at least a portion of the first barrier layer, and
   (v) forming a first bonding layer overlying at least a portion of the first electrically conductive trace and overlying at least a portion of the first barrier layer, and at least partially surrounding the one or more first electrically conductive interconnects;
   preparing a second electronic device having a second substrate, one or more second electrically conductive interconnects, and a second bonding layer;
   contacting the one or more first electrically conductive interconnects with the one or more second electrically conductive interconnects; and
   contacting the first bonding layer with the second bonding layer.

2. The integration method according to claim 1, further comprising:
   bonding the first bonding layer to the second bonding layer; and
   bonding via temperature treatment the one or more first electrically conductive interconnects to the one or more second electrically conductive interconnects, whereby diffusion occurs between the one or more first electrically conductive interconnects and the one or more second electrically conductive interconnects.

3. The integration method according to claim 1, wherein the preparing the second electronic device further comprises the following sequential steps:
   (i) forming a second electrically conductive trace overlying at least a portion of the second substrate;
   (ii) forming a second barrier layer overlying at least a portion of the second electrically conductive trace;
   (iii) forming the one or more second electrically conductive interconnects in contact with the second barrier layer; and
   (iv) forming the second bonding layer overlying at least a portion of the second electrically conductive trace and overlying at least a portion of the second barrier layer, and at least partially surrounding the one or more second electrically conductive interconnects.

4. The integration method according to claim 3, comprising:
   preparing a side of the second electronic device opposite a side of the second electronic device on which the one or more second electrically conductive interconnects is formed, including the following sequential steps:
   (i) forming a third electrically conductive trace overlying at least a portion of the second substrate opposite the second electrically conductive trace;
   (ii) forming a third barrier layer overlying at least a portion of the third electrically conductive trace;
   (iii) forming one or more third electrically conductive interconnects in contact with the third barrier layer; and
   (iv) forming a third bonding layer overlying at least a portion of the third electrically conductive trace and overlying at least a portion of the third barrier layer, and at least partially surrounding the one or more third electrically conductive interconnects; and preparing a third electronic device having a third substrate, one or more fourth electrically conductive interconnects, and a fourth bonding layer;

bonding via direct contact the third bonding layer to the fourth bonding layer; and bonding via temperature treatment the one or more third electrically conductive interconnects to the one or more fourth electrically conductive interconnects, whereby diffusion occurs between the one or more third electrically conductive interconnects and the one or more fourth electrically conductive interconnects.

5. The integration method according to claim 4, further comprising:

bonding the first bonding layer to the second bonding layer; and bonding via temperature treatment the one or more first electrically conductive interconnects to the one or more second electrically conductive interconnects, whereby diffusion occurs between the one or more first electrically conductive interconnects and the one or more second electrically conductive interconnects;

wherein the bonding via temperature treatment of the one or more first electrically conductive interconnects to the one or more second electrically conductive interconnects results in completion of a first integration stacking sequence;

wherein the bonding via temperature treatment of the one or more third electrically conductive interconnects to the one or more fourth electrically conductive interconnects results in completion of a second stacking sequence; and wherein the integration method further comprises forming at least one additional device by the following steps:

forming an additional electrically conductive trace;

forming an additional barrier layer on the additional electrically conductive trace;

forming one or more additional electrically conductive interconnects on the additional barrier layer;

forming an additional bonding layer overlying at least a portion of the additional electrically conductive trace and at least partially surrounding the one or more additional electrically conductive interconnects to define a vertically integrated stacked electronic device assembly.

6. The integration method according to claim 1, further comprising:

removing a portion of the first bonding layer to expose respective outwardly addressable faces of the one or more first electrically conductive interconnects, and removing a portion of the second bonding layer to expose respective outwardly addressable faces of the one or more second electrically conductive interconnects; and contacting the respective outwardly addressable faces of the one or more first electrically conductive interconnects with the respective outwardly addressable faces of the one or more second electrically conductive interconnects.

7. The integration method according to claim 1, further comprising:

after the forming the first barrier layer and before the forming the one or more first electrically conductive interconnects, performing the following sequential steps:

(i) forming a first photoresist layer overlying at least a portion of the first barrier layer; and (ii) patterning the first photoresist layer to form one or more channels in the first photoresist layer;

wherein the one or more first electrically conductive interconnects are formed in the one or more channels in the first photoresist layer.

8. The integration method according to claim 7, further comprising:

after the patterning the first photoresist layer, after the forming the one or more first electrically conductive interconnects, and before the forming the first bonding layer, performing the following step:

removing at least a portion of the first photoresist layer such that the one or more first electrically conductive interconnects remain.

9. The integration method according to claim 1, further comprising:

forming a first seed layer overlying at least a portion of the first barrier layer, the first barrier layer being configured to accept formation of the first seed layer thereon;

wherein the first seed layer is configured to accept formation of the one or more first electrically conductive interconnects such that at least those portions of the first seed layer in contact with the one or more first electrically conductive interconnects become an integral portion of the one or more first electrically conductive interconnects.

10. The integration method according to claim 1, further comprising:

forming a first adhesion layer overlying at least a portion of the first substrate;

wherein the first adhesion layer is interposed between the first substrate and the first electrically conductive trace.

11. The integration method according to claim 4, comprising:

forming one or more electrically conductive vias through the second substrate to electrically connect the second electrically conductive trace with the third electrically conductive trace.

12. The integration method according to claim 1, wherein the first electrically conductive trace is made with a first metallic material;

wherein the one or more first electrically conductive interconnects are made with a second metallic material that is different from the first metallic material; and wherein the first barrier layer is interposed between the first electrically conductive trace and the one or more first electrically conductive interconnects, the first barrier layer being configured to prevent interdiffusion of the one or more first electrically conductive interconnects with the first electrically conductive trace.

13. The integration method according to claim 12, wherein the one or more first electrically conductive interconnects are made from a transition metal; and wherein the first bonding layer is made from a non-metallic oxide.

14. The integration method according to claim 1, wherein the first electrically conductive trace is formed by physical vapor deposition, chemical vapor deposition, vapor phase deposition, or sputtering;

wherein the first barrier layer is formed by physical vapor deposition, chemical vapor deposition, vapor phase deposition, or sputtering;

wherein the one or more first electrically conductive interconnects are formed by physical vapor deposition, chemical vapor deposition, sputtering, or electroplating; and wherein the first bonding layer is formed by chemical vapor deposition, sputtering, spin-on glass process, or plasma enhanced CVD.

15. An integration method for an electronic device comprising:

preparing a first electronic device having a first substrate, the preparing the first electronic device including the following sequential steps:

(i) forming a first electrically conductive trace overlying at least a portion of the first substrate;

(ii) forming a first barrier layer overlying an entire upper surface of the first electrically conductive trace;

(iii) forming a first photoresist layer overlying at least a portion of the first barrier layer;

(iv) etching the first photoresist layer to form one or more channels in the first photoresist layer;

(v) forming one or more first electrically conductive interconnects in the one or more channels in the first photoresist layer, the one or more first electrically conductive interconnects overlying at least a portion of the first barrier layer;

(vi) removing at least a portion of the first photoresist layer such that the one or more first electrically conductive interconnects remain;

(vii) patterning the first electrically conductive trace by removing one or more portions of the first electrically conductive trace and one or more portions of the first barrier layer; and (viii) forming a first bonding layer overlying at least a portion of the first electrically conductive trace and overlying at least a portion of the first barrier layer, and at least partially surrounding the one or more first electrically conductive interconnects.

* * * * *